(12) United States Patent
Goto et al.

(10) Patent No.: US 9,040,402 B2
(45) Date of Patent: May 26, 2015

(54) FABRICATION METHOD OF SILICON CARBIDE SEMICONDUCTOR DEVICE

(71) Applicants: FUJI ELECTRIC CO., LTD., Kawasaki-shi, Kanagawa (JP); NATIONAL INSTITUTE OF ADVANCED INDUSTRIAL SCIENCE AND TECHNOLOGY, Tokyo (JP)

(72) Inventors: Masahide Goto, Matsumoto (JP); Kenji Fukuda, Tsukuba (JP); Noriyuki Iwamuro, Tsukuba (JP)

(73) Assignees: FUJI ELECTRIC CO., LTD., Kawasaki-shi (JP); NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 0 days.

(21) Appl. No.: 14/388,749

(22) PCT Filed: Mar. 14, 2013

(86) PCT No.: PCT/JP2013/057313

§ 371 (c)(1),
(2) Date: Sep. 26, 2014

(87) PCT Pub. No.: WO2013/146327

PCT Pub. Date: Oct. 3, 2013

(65) Prior Publication Data

US 2015/0064898 A1    Mar. 5, 2015

(30) Foreign Application Priority Data

Mar. 28, 2012   (JP) ................................ 2012-073029

(51) Int. Cl.
*H01L 21/04*    (2006.01)
*H01L 29/66*    (2006.01)
(Continued)

(52) U.S. Cl.
CPC ...... *H01L 29/66068* (2013.01); *H01L 29/1606* (2013.01); *H01L 21/0475* (2013.01); *H01L 21/0485* (2013.01); *H01L 21/3065* (2013.01); *H01L 29/45* (2013.01); *H01L 29/43* (2013.01)

(58) Field of Classification Search
CPC . H01L 21/033; H01L 21/048; H01L 21/0485; H01L 29/43; H01L 29/45; H01L 29/1608
USPC ................... 438/571, 586, 597; 257/E21.062
See application file for complete search history.

(56) References Cited

U.S. PATENT DOCUMENTS

2011/0220918 A1*   9/2011   Sugai .............................. 257/77

FOREIGN PATENT DOCUMENTS

JP        2006-032458 A    2/2006
JP        2006-041248 A    2/2006
(Continued)

OTHER PUBLICATIONS

Notification of Transmittal of Translation of the International Preliminary Report on Patentability (Chapter I or Chapter II) (Form PCT/IB/338) of International Application No. PCT/JP2013/057313 mailed Oct. 9, 2014 with Forms PCT/IB/373, PCT/IB/326 and PCT/ISA/237. (17 pages).

(Continued)

*Primary Examiner* — Thanhha Pham
(74) *Attorney, Agent, or Firm* — Westerman, Hattori, Daniels & Adrian, LLP

(57) ABSTRACT

A first metal layer (3) is formed on a back face of a silicon carbide substrate (1) to a degree such that the first metal layer (3) does not fully cover the back face of the silicon carbide substrate. Many holes (4) are formed on the back face of the silicon carbide substrate (1) by dry-etching the back face of the silicon carbide substrate (1) using the first metal layer (3) as a mask therefor. A second metal layer constituting an ohmic contact is formed on the first metal layer (3) and the back face of the silicon carbide substrate (1) including inner surfaces of the many holes (4).

10 Claims, 1 Drawing Sheet

(51) Int. Cl.
*H01L 29/16* (2006.01)
*H01L 21/3065* (2006.01)
*H01L 29/45* (2006.01)
*H01L 29/43* (2006.01)

(56) References Cited

FOREIGN PATENT DOCUMENTS

| JP | 2008-135611 A | 6/2008 |
|---|---|---|
| JP | 2008-141015 A | 6/2008 |
| JP | 2009-283754 A | 12/2009 |

OTHER PUBLICATIONS

International Search Report dated Jun. 18, 2013, issued in corresponding application No. PCT/JP2013/057313.
Kasugai, Hideki, et al., "High-Efficiency Nitride-Based Light-Emitting Diodes with Moth-Eye Structure", Japanese Journal of Applied Physics, 2005, vol. 44, No. 10, pp. 7414-7417.
Saji, et al., "Interface Characteristics and Junction Characteristics of Metal-SiC", Research Conference Documents of The Institute of Electrical Engineers of Japan, Electronic Device Material Conference, EFM-90-20, Japan, 1990, pp. 31-39, w/Partial English translation.
Suzuki, Takuma, et al., "SiC-MOSFET with-High Channel Mobility and High Reliability", Toshiba Review, Japan, 2008, vol. 63, No. 10, pp. 39-43, w/Partial English translation.

\* cited by examiner

FABRICATION METHOD OF SILICON CARBIDE SEMICONDUCTOR DEVICE

TECHNICAL FIELD

The present invention relates to a fabrication method of a silicon carbide semiconductor.

BACKGROUND ART

Single-crystal silicon carbide has a band gap and a critical electric field strength that significantly exceed that of single-crystal silicon. Therefore, single-crystal silicon carbide replaces the current mainstream insulated gate bipolar transistors (IGBTs) of high voltage semiconductor devices with transistors such as metal oxide semiconductor field effect transistors (IGFETs) and bipolar junction transistors (BJTs) for which loss is lower than for IGBTs; or is expected to be a semiconductor material that can realize an ultra-high voltage semiconductor device for voltage exceeding 10 kV as a single device. In the process for fabricating the silicon carbide semiconductor device, when an ohmic contact is formed, the simplest manner is to deposit a thin metal film on a single-crystal silicon carbide substrate, and to apply thereto heat annealing at about 1,000 degrees C. in an inert gas such as argon (Ar). At present, the material of the metal thin film used to form the ohmic contact is generally a nickel (Ni)-based metal.

In a vertical semiconductor device, electric current has to flow in the back face of the substrate and therefore, one of the most important tasks is to reduce the contact resistance between the back face of the substrate and a back face metal. As a solution, the dopant concentration in the back face of the substrate may be increased, or the effective area of the back face of the substrate can be increased by intentionally roughing the back face. In particular, the latter can be realized using relatively simple processing such as grinding and therefore, it is estimated that this method is advantageous for the fabrication of the semiconductor device.

Nonetheless, the single-crystal silicon carbide substrate is typically a highly fragile material and therefore, when machine work is applied to the back face after fabricating the device structure on the front face, pressure may locally concentrate and this may lead to cracking and chipping of the substrate. In contrast, when the back face of the substrate is roughened by grinding, etc., in the early stage of the overall fabrication process before the fabrication of the device structure on the front face, dust tends to be generated when the substrate is conveyed at this process step and thereafter and therefore, the yield may be reduced especially for a device that needs to have fine structures such as transistors fabricated therein.

It is known especially for the MOSFET among the types of transistor that the device properties such as the mobility can significantly be improved by terminating using a hydrogen atom a dangling bond of a silicon atom present in the interface between the gate oxide film and the silicon carbide. To avoid breaking this hydrogen terminal, it is important to lower the temperature as much as possible of the process steps to form the gate electrode and those thereafter. On the other hand, a higher annealing temperature is more advantageous for reducing the contact resistance of the back face metal on the back face of the substrate and therefore, a solution is necessary for these conflicting requirements to fabricate the MOSFET.

Patent Document 1: Japanese Laid-open Publication No. 2006-32458
Patent Document 2: Japanese Laid-open Publication No. 2006-41248
Non-patent Literature 1: Saji, et al, Research Conference Documents of The Institute of Electrical Engineers of Japan, Electronic Device Material Conference, EFM-90-20, 1990.
Non-Patent Literature 2: Toshiba Review, Vol. 63, No. 10, p. 39 (2008).

DISCLOSURE OF INVENTION

Problem to be Solved by the Invention

To fabricate a semiconductor device, especially a vertical semiconductor device, on a silicon carbide substrate, an ohmic contact is formed on the back face of the substrate and, when the contact resistance of the back face metal is high, a problem arises in that this high contact resistance directly and adversely affects the ON-resistance of the device, etc.

When the method is employed of roughing the back face of the substrate by grinding, etc., at a process step in the early stage of the process for manufacturing the silicon carbide semiconductor device, dust tends to be generated when the substrate is conveyed as above and therefore, the yield may be reduced especially for a device that needs to have fine structures such as transistors fabricated therein.

For the MOSFET, the degradation of properties such as mobility can be prevented when the temperature is reduced as much as possible at the process steps for forming the gate electrode and those thereafter. However, a higher heat annealing temperature is more advantageous for reducing the resistance at the process step to form the ohmic contact executed after the process step to form the gate electrode. Therefore, a problem arises in that a solution is necessary for these conflicting requirements.

To solve the above problems involved in the conventional techniques, an object of the present invention is to provide a fabrication method for a silicon carbide semiconductor device that enables formation of the ohmic contact on the back face of the silicon carbide substrate at a low temperature and that also enables reduction of the contact resistance between the back face metal and the silicon carbide semiconductor.

Means for Solving Problem

To solve the problems above and achieve an object, the silicon carbide semiconductor device fabrication method according to the present invention has the following characteristics. A first metal layer is formed on a back face of a silicon carbide substrate to a degree such that the first metal layer does not fully cover the back face of the silicon carbide substrate. Many holes are formed on the back face of the silicon carbide substrate by dry-etching the back face of the silicon carbide substrate using the first metal layer as a mask therefor. A second metal layer constituting an ohmic contact is formed on the first metal layer and the back face of the silicon carbide substrate including inner surfaces of the many holes.

In the silicon carbide semiconductor device fabrication method according to the present invention, the first metal layer is a nickel layer or an alloy layer including at least one of nickel, titanium, zirconium, and hafnium.

To solve the problems above and achieve an object, the silicon carbide semiconductor device fabrication method according to the present invention has the following characteristics. A first metal layer is formed on a back face of a silicon carbide substrate such that the first metal layer fully covers the back face of the silicon carbide substrate and thereafter, the first metal layer is selectively removed causing a thickness of the first metal layer to be a thickness with which the first metal layer does not fully cover the back face of the silicon carbide substrate. Many holes are formed on the back face of the silicon carbide substrate by dry-etching the back face of the silicon carbide substrate using the first metal layer as a mask therefor. A second metal layer constituting an ohmic contact is formed on the first metal layer and the back face of the silicon carbide substrate including inner surfaces of the many holes.

In the silicon carbide semiconductor device fabrication method according to the present invention, the first metal layer is a nickel layer or an alloy layer including at least one of nickel, titanium, zirconium, and hafnium.

In the silicon carbide semiconductor device fabrication method according to the present invention, the dry-etching for the back face of the silicon carbide substrate is executed using halogen-based plasma.

In the silicon carbide semiconductor device fabrication method according to the present invention, the first metal layer and the second metal layer are formed by the same metal.

In the silicon carbide semiconductor device fabrication method according to the present invention, the forming of the first metal layer, the forming of the many holes, and the forming of the second metal layer are executed after forming a front face structure on a front face of the silicon carbide substrate.

In the silicon carbide semiconductor device fabrication method according to the present invention, a thickness of the first metal layer is 1 nm to 50 nm.

In the silicon carbide semiconductor device fabrication method according to the present invention, a vertical semiconductor device is fabricated.

According to the present invention, the contact resistance between the back face metal and the silicon carbide semiconductor can be reduced even when the heat annealing temperature is reduced for forming the ohmic contact (the second metal layer) because many holes are formed on the back face of the silicon carbide substrate by dry-etching the back face of the silicon carbide substrate using the first metal layer as the mask.

According to the present invention, no machine work is applied to the back face of the silicon carbide substrate and therefore, the substrate back face roughing step to reduce the contact resistance between the back face metal and the silicon carbide semiconductor can be executed after forming the front face structure of the silicon carbide semiconductor device such as the formation of the gate electrode. Therefore, any cracking or chipping of the silicon carbide substrate can be prevented and no dust is generated when the substrate is conveyed. Therefore, adverse effects on yield can be suppressed.

According to the present invention, the first metal layer to be the mask can be included finally in the ohmic contact (the second metal layer) by using the same metal to form the first metal layer and the ohmic electrode.

Effect of the Invention

According to the fabrication method for the silicon carbide semiconductor device according to the present invention, an effect is achieved that the ohmic contact on the back face of the silicon carbide substrate can be formed at a low temperature and the contact resistance can be reduced between the back face metal and the silicon carbide semiconductor.

BEST MODE(S) FOR CARRYING OUT THE INVENTION

Concept of Present Invention

Figure 1:
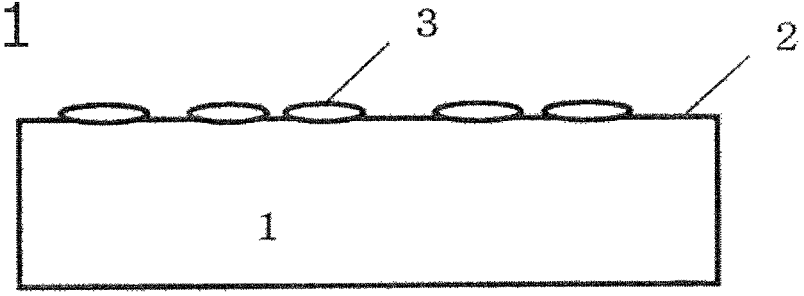
FIG. 1 is a schematic diagram of a state immediately after Ni is very thinly deposited on a back face of a silicon carbide substrate in a silicon carbide semiconductor device fabrication method according to a first embodiment.

The inventors sought a processing method according to which an ohmic contact could be formed on the back face of a silicon carbide substrate even after the device structure for the front face was fabricated thereon; substantially no mechanical pressure needed to be applied to the silicon carbide substrate; and the temperature at which the process step to form the back face ohmic contact could be reduced. As a result, the inventors found that the problems involved in the traditional techniques could be solved by depositing a very thin metal on the back face of the silicon carbide substrate and thereafter, dry-etching the silicon carbide substrate using the metal as a mask, and the inventors completed the present invention.

A metal including, for example, Ni is very thinly deposited on the back face of the silicon carbide substrate using a method to form a thin film such as sputtering to a degree that the deposited metal does not fully cover the back face and thereafter, dry-etching is executed for the silicon carbide substrate using the metal as a mask therefor (hereinafter, referred to as "mask metal"). Thus, the back face of the silicon carbide substrate can be roughened without any machine work such as grinding. A process step of removing the mask metal can be omitted by using the same element as the metal used as the material of the back face metal, also as the element included in the mask metal.

Preferred embodiments of a silicon carbide semiconductor device fabrication method according to the present invention will be described in detail with reference to the accompanying drawings. In the description of the embodiments and accompanying drawings, identical components are given the same reference numeral and redundant description is omitted.

First Embodiment

Figure 2:
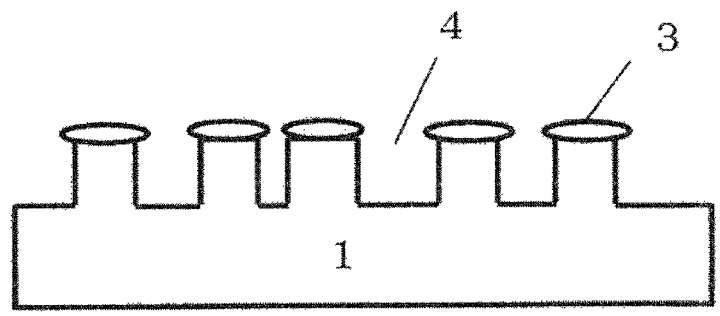
FIG. 2 is a schematic cross-sectional diagram of a state immediately after the back face of the silicon carbide substrate is dry-etched in the fabrication method according to the first embodiment.

A fabrication method for a silicon carbide semiconductor device according to the first embodiment will be described. FIG. 1 is a schematic diagram of the state immediately after Ni is very thinly deposited on the back face of a silicon carbide substrate in the silicon carbide semiconductor device fabrication method according to the first embodiment. FIG. 2 is a schematic cross-sectional diagram of the state immediately after the back face of the silicon carbide substrate is dry-etched in the fabrication method according to the first embodiment. A front face structure (not depicted) of the silicon carbide semiconductor device is first fabricated on the front face of the silicon carbide substrate 1 up to at least a process step for forming a switching electrode (a MOS gate (an insulated gate including a metal/an oxide/a semiconductor) structure for a MOSFET or an IGBT, or a base region for a BJT). For the silicon carbide semiconductor device, the ohmic contact on the front face and the back face ohmic contact on the back face 2 can also be simultaneously treated in one heat annealing process. Therefore, when the front face structure of the silicon carbide semiconductor device is formed, preferably, fabrication up to the pattern formation of the the front face metal is executed if possible.

Using a method of forming a thin film such as sputtering, a first metal layer 3 (for example, Ni) is very thinly deposited on the back face 2 of the silicon carbide substrate 1 to the degree that the deposited first metal layer 3 does not fully cover the back face 2 of the silicon carbide substrate 1 (see FIG. 1). There are two reasons for selecting Ni as the material of the first metal layer 3: Ni has high resistance against halogen-based plasma used in the dry-etching for the silicon carbide substrate 1 and Ni as its nature tends to form crevices when deposited and therefore, this nature acts advantageously in the present invention.

The upper limit of the film thickness of the first metal layer 3 (the film thickness of Ni) at the degree that the deposited first metal layer 3 does not fully cover the back face 2 of the silicon carbide substrate 1 is preferably 50 nm or less, and is more preferably 20 nm or less. On the other hand, preferably, the lower limit of the film thickness of the first metal layer 3 is 1 nm or greater to cause the back face 2 of the silicon carbide substrate 1 to have thereon a significant difference in height, taking into consideration that the etching selection ratio of the Ni mask (the first metal layer 3) to the silicon carbide substrate 1 is 10 to 40 under the common dry-etching condition for the silicon carbide substrate 1, and that the surface roughness of the silicon carbide substrate 1 with a mirror finish is less than 10 nm.

Dry-etching is executed for the back face 2 of the silicon carbide substrate 1 using a halogen-based plasma. Because the first metal layer 3 is unevenly deposited on the back face 2 of the silicon carbide substrate 1, exposed portions of the back face 2 of the silicon carbide substrate 1 are selectively removed and roughness is generated on the back face 2 of the silicon carbide substrate 1 (see FIG. 2). The first metal layer 3 may remain on the back face 2 of the silicon carbide substrate 1 even at the end of the dry-etching depending on the film thickness of the first metal layer 3. However, Ni used as the material of the first metal layer 3 is also the material of the back face ohmic contact and therefore, removal of the first metal layer 3 does not especially need to be executed and the remaining Ni only has to finally be caused to be included in and as a portion of the back face ohmic contact (the second metal layer).

The value of the contact resistance between the back face metal (not depicted) and the silicon carbide substrate 1 differs depending on the depth to which the exposed portions of the back face 2 of the silicon carbide substrate 1 are dry-etched. However, the value can be calculated as follows. For example, the state of the back face 2 of the silicon carbide substrate 1 after the dry-etching is executed therefor using the first metal layer 3 as the mask, is approximately assumed as the state where countless cubic fine holes 4 are present whose side lengths are each "a" (on the order of nm to sub-nm). When no holes 4 are present, the surface area of the region to have the holes 4 formed therein is ($a \times a = a^2$). On the other hand, when the holes 4 are present, the side walls and the bottom faces of the holes 4 are exposed and therefore, in the portion having the holes 4, the surface area is increased to a surface area five times as large ($5a^2$) as that for the case where no holes 4 are present ($a^2$). Therefore, even under heat annealing conditions identical to conventional conditions, the contact resistance between the back face metal and the silicon carbide substrate 1 can be reduced by about 80% in the present invention.

As described, according to the first embodiment, the back face of the silicon carbide substrate is dry-etched using the first metal layer as the mask therefor and, thereby, many holes are formed on the back face of the silicon carbide substrate and therefore, the back face of the silicon carbide substrate can be roughened. Therefore, even when the heat annealing temperature is reduced for forming the back face ohmic contact, the contact resistance between the back face metal and the silicon carbide semiconductor can be reduced.

According to the first embodiment, no machine work is necessary for the back face of the silicon carbide substrate. Therefore, the substrate back face roughing step to reduce the contact resistance between the back face metal and the silicon carbide semiconductor can be executed after the front face structure of the silicon carbide semiconductor device is formed such as the formation of the gate electrode, etc. Therefore, any cracking and chipping of the silicon carbide substrate can be prevented and no dust is generated when the substrate is conveyed. Therefore, adverse effects on the yield can be suppressed.

According to the first embodiment, the first metal layer to be the mask can be included finally in the ohmic contact by using the same metal to form the first metal layer and the electrode.

Second Embodiment

The fabrication method for a silicon carbide semiconductor device according to the second embodiment will be described. In the fabrication method for a silicon carbide semiconductor device according to the second embodiment, the process steps up to the fabrication of the front face structure of the silicon carbide semiconductor device are the same as those in the first embodiment and will not again be described.

The front face structure is fabricated on the front face of the silicon carbide substrate 1 according to the same process steps as those in the first embodiment. The first metal layer 3 (for example, Ni) is thickly (for example, 80 nm or greater) deposited on the back face 2 of the silicon carbide substrate 1 using a method to form a thin film such as sputtering to the degree that the first metal layer 3 fully covers the back face 2 of the silicon carbide substrate 1 and, thereafter, chemical solution treatment is executed. Thereby, the first metal layer 3 is incompletely etched such that the back face 2 of the silicon carbide substrate 1 is selectively exposed. No limit especially needs to be imposed when the film thickness of the first metal layer 3 immediately after the deposition thereof is 80 nm or greater. However, the range of the film thickness of the first metal layer 3 after the chemical solution treatment is executed is preferably, for example, about 1 nm to about 50 nm, and is more preferably, for example, about 1 nm to about 20 nm advantageously.

Preferably, the chemical solution used to etch the first metal layer 3 is a mixed liquid including phosphoric acid and nitric acid, or a mixed liquid including phosphoric acid, nitric acid, and acetic acid because of the ease of procurement. The dry-etching for the back face 2 of the silicon carbide substrate 1 is also the same as that in the first embodiment and will not again be described.

As described, according to the second embodiment, the same effect as that of the first embodiment can be achieved.

Third Embodiment

Figure 3:
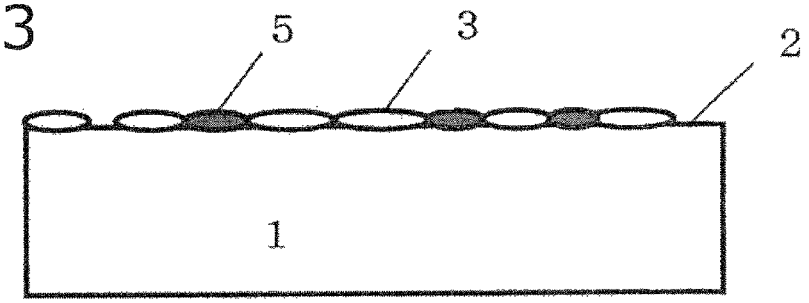
FIG. 3 is a schematic cross-sectional diagram of a state immediately after a Ni-based alloy is very thinly deposited on the back face of the silicon carbide substrate in the fabrication method for a silicon carbide semiconductor device according to a third embodiment.
Figure 4:
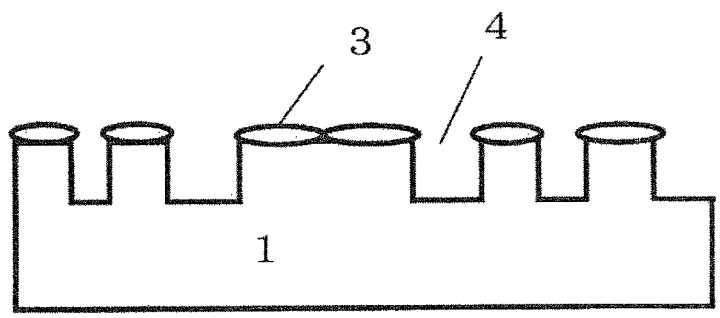
FIG. 4 is a schematic cross-sectional diagram of a state immediately after the back face of the silicon carbide substrate is dry-etched in the fabrication method for a silicon carbide semiconductor device according to the third embodiment.

The fabrication method for a silicon carbide semiconductor device according to the third embodiment will be described. FIG. 3 is a schematic cross-sectional diagram of the state immediately after a Ni-based alloy is very thinly deposited on the back face of the silicon carbide substrate in the fabrication method for a silicon carbide semiconductor device according to the third embodiment. FIG. 4 is a schematic cross-sectional diagram of the state immediately after the back face of the silicon carbide substrate is dry-etched in the fabrication method for a silicon carbide semiconductor device according to the third embodiment. In the fabrication method for a silicon carbide semiconductor device according to the third embodiment, the process steps up to the fabrication of the front face structure of the silicon carbide semiconductor device are the same as those in the first embodiment and will not again be described.

The front face structure (not depicted) of the silicon carbide substrate 1 is fabricated according to the same process steps as those in the first embodiment. An alloy layer including Ni (a metal denoted by the reference numeral "3") and further including any one or more metal(s) of titanium (Ti), zirconium (Zr), and hafnium (Hf) is very thinly deposited on the back face 2 of the silicon carbide substrate 1 using a method to form a thin film such as sputtering to the degree that the alloy layer does not fully cover the back face 2 of the silicon carbide substrate 1 (see FIG. 3). Similar to the first metal layer of the first embodiment, the range of the film thickness of the alloy layer at the degree that the alloy layer does not fully cover the back face 2 of the silicon carbide substrate 1 is preferably 1 nm to 50 nm, and is more preferably 1 nm to 20 nm advantageously. The composition of the alloy layer is not especially limited provided that the alloy layer includes Ni. However, based on the nature of the present invention, preferably, the Ni content in the alloy layer is about 50% by molar ratio.

The back face 2 of the silicon carbide substrate 1 is dry-etched. Ni is unevenly deposited on the back face 2 of the silicon carbide substrate 1 and, in addition, a metal 5 other than Ni is unevenly deposited thereon. In the third embodiment, the metal 5 other than Ni is instantaneously removed from the back face 2 of the silicon carbide substrate 1 by being exposed to the halogen-based plasma and new crevices are formed. Therefore, the back face 2 of the silicon carbide substrate 1 can be more assuredly roughened (see FIG. 4).

Ni included in the alloy layer used as the mask for dry-etching the back face 2 of the silicon carbide substrate 1 is also the material of the back face ohmic contact. Therefore, similar to the first embodiment, removal of Ni does not need to especially be executed. Even when any one or more metal(s) of Ti, Zr, and Hf (the metal(s) 5 other than Ni) remain(s), the metal(s) bond(s) with carbon (C) in the silicon carbide substrate 1 and is/are included in the silicon carbide substrate 1 during the formation of the back face ohmic contact. Therefore, the metal(s) 5 other than Ni do(es) not need to especially be removed. The value of the contact resistance between the back face metal and the silicon carbide substrate 1 is the same as that in the first embodiment and will not again be described.

As described, according to the third embodiment, the same effect as that of the first embodiment can be achieved.

Fourth Embodiment

The fabrication method for a silicon carbide semiconductor device according to the fourth embodiment will be described. In the fabrication method for a silicon carbide semiconductor device according to the fourth embodiment, the process steps up to the fabrication of the front face structure of the silicon carbide semiconductor device are the same as those in the first embodiment and will not again be described.

The front face structure is fabricated on the front face of the silicon carbide substrate 1 according to the same process steps as those in the first embodiment. An alloy layer including Ni and any one or more metal(s) of Ti, Zr, and Hf is thickly (50 nm or thicker) deposited on the back face 2 of the silicon carbide substrate 1 using a method to form a thin film such as sputtering to the degree that the alloy layer fully covers the back face 2 of the silicon carbide substrate 1 and thereafter, the chemical solution treatment is executed. Thereby, the alloy layer is incompletely etched such that the back face 2 of the silicon carbide substrate 1 is selectively exposed. No limit needs to especially be imposed on the film thickness of the alloy layer immediately after deposition provided this film thickness is 50 nm or greater. However, the range of the film thickness of the alloy layer after the chemical solution treatment is executed therefor is preferably, for example, about 1 nm to about 50 nm, and is more preferably, for example, about 1 nm to about 20 nm advantageously.

Preferably, the chemical solution used to etch the alloy layer is a mixed liquid including phosphoric acid and nitric acid, or a mixed liquid including phosphoric acid, nitric acid, and acetic acid, or a mixed liquid including ammonia and hydrogen peroxide water because of their easy procurement. Especially, the mixed liquid including ammonia and hydrogen peroxide water does not corrode at all Ni in the alloy layer; can selectively remove the metal(s) 5 other than Ni; therefore, can alleviate the restriction on the chemical solution immersion time period; and is therefore very preferable. The dry-etching for the back face 2 of the silicon carbide substrate 1 is also the same as that in the first embodiment and will not again be described.

As described, according to the fourth embodiment, the same effect as that of the first embodiment can be achieved.

INDUSTRIAL APPLICABILITY

As described, the fabrication method for a silicon carbide semiconductor device according to the present invention is useful for a semiconductor apparatus including an ohmic contact between the metal layer and the silicon carbide substrate.

EXPLANATIONS OF LETTERS OR NUMERALS

1 silicon carbide substrate
2 silicon carbide substrate back face
3 first metal layer (Ni)
4 fine holes formed on substrate back face by dry-etching
5 metal including at least one selected from Ti, Zr, and Hf.

The invention claimed is:

1. A silicon carbide semiconductor device fabrication method comprising:
   forming a first metal layer on a back face of a silicon carbide substrate to a degree such that the first metal layer does not fully cover the back face of the silicon carbide substrate;
   forming many holes on the back face of the silicon carbide substrate by dry-etching the back face of the silicon carbide substrate using the first metal layer as a mask therefor; and
   forming a second metal layer constituting an ohmic contact, on the first metal layer and the back face of the silicon carbide substrate including inner surfaces of the many holes.

2. The silicon carbide semiconductor device fabrication method according to claim 1, wherein
   the first metal layer is a nickel layer or an alloy layer including at least one of nickel, titanium, zirconium, and hafnium.

3. The silicon carbide semiconductor device fabrication method according to claim 1, wherein
   the dry-etching for the back face of the silicon carbide substrate is executed using halogen-based plasma.

4. The silicon carbide semiconductor device fabrication method according to claim 1, wherein
   the first metal layer and the second metal layer are formed by the same metal.

5. The silicon carbide semiconductor device fabrication method according to claim 1, wherein
   the forming of the first metal layer, the forming of the many holes, and the forming of the second metal layer are executed after forming a front face structure on a front face of the silicon carbide substrate.

6. The silicon carbide semiconductor device fabrication method according to claim 1, wherein
   a thickness of the first metal layer is 1 nm to 50 nm.

7. The silicon carbide semiconductor device fabrication method according to claim 1, wherein
   a vertical semiconductor device is fabricated.

8. A silicon carbide semiconductor device fabrication method comprising:
   forming a first metal layer on a back face of a silicon carbide substrate such that the first metal layer fully covers the back face of the silicon carbide substrate and thereafter, selectively removing the first metal layer causing a thickness of the first metal layer to be a thickness with which the first metal layer does not fully cover the back face of the silicon carbide substrate;
   forming many holes on the back face of the silicon carbide substrate by dry-etching the back face of the silicon carbide substrate using the first metal layer as a mask therefor; and
   forming a second metal layer constituting an ohmic contact, on the first metal layer and the back face of the silicon carbide substrate including inner surfaces of the many holes.

9. The silicon carbide semiconductor device fabrication method according to claim 8, wherein
   the first metal layer is a nickel layer or an alloy layer including at least one of nickel, titanium, zirconium, and hafnium.

10. The silicon carbide semiconductor device fabrication method according to claim 8, wherein
    a vertical semiconductor device is fabricated.

* * * * *